United States Patent
Gehring

(10) Patent No.: US 7,439,820 B2
(45) Date of Patent: Oct. 21, 2008

(54) REDUCING THE SETTLING TIME OF A CRYSTAL OSCILLATOR

(75) Inventor: Mark R. Gehring, Portland, OR (US)

(73) Assignee: Cypress Semiconductor Corp., San Jose, CA (US)

( * ) Notice: Subject to any disclaimer, the term of this patent is extended or adjusted under 35 U.S.C. 154(b) by 22 days.

(21) Appl. No.: 11/465,439

(22) Filed: Aug. 17, 2006

(65) Prior Publication Data

US 2007/0069829 A1   Mar. 29, 2007

Related U.S. Application Data

(60) Provisional application No. 60/720,856, filed on Sep. 26, 2005.

(51) Int. Cl.
 *H03B 5/32* (2006.01)
(52) U.S. Cl. .............. 331/158; 331/116 R; 331/116 FE
(58) Field of Classification Search ............. 331/116 R, 331/116 FE, 154, 158, 160, 185, 186
See application file for complete search history.

(56) References Cited

U.S. PATENT DOCUMENTS 5,107,208 A * 4/1992 Lee ............................. 714/733
5,606,295 A * 2/1997 Ohara et al. ............ 331/116 FE
5,805,027 A * 9/1998 Yin ........................ 331/116 FE
5,982,246 A * 11/1999 Hofhine et al. ......... 331/116 FE
6,057,742 A * 5/2000 Prado .......................... 331/158
7,009,458 B2 * 3/2006 Gazit ...................... 331/116 R

FOREIGN PATENT DOCUMENTS

WO   WO 2004036733 A2 *   4/2004

OTHER PUBLICATIONS

Chrontel, Application Notes (AN06), "Crystel Oscillator," 206-0000-006, Rev. 1.2, Jul. 26, 2001 (4 pages).
Philips Semiconductors, (AN10289) Application Note, "LPC900 External Crystal Start-Up," Rev. 01-27, Apr. 2005 (12 pages).
Freescale Semiconductor (AN2907D) Application Note, "32 kHz Oscillator Start-Up Time and Pro Pulse Width Considerations," Rev. 0, Jan. 2005 (14 pages).
Mahmoud Addouche et al., Modeling of Quartz Crystal Oscillators by Using Nonlinear Dipolar Method, IEEE Transactions on Ultrasonics, Ferroelectrics, and Frequency Control, vol. 50, No. 5, May 2003, pp. 487-495.
Eric A. Vittoz et al., "High-Performance Crystal Oscillator Circuits: Theory and Application", IEEE Journal of Solid-State Circuits, vol. 23, No. 3, Jun. 1988, pp. 774-783.

* cited by examiner

*Primary Examiner*—Robert J. Pascal
*Assistant Examiner*—Ryan J. Johnson
(74) *Attorney, Agent, or Firm*—Blakely, Sokoloff, Taylor & Zafman LLP

(57) ABSTRACT

A method and system for initiating the oscillation of a crystal that controls a crystal oscillator by applying an initiating pulse to said crystal. The initiating pulse having a pulse width less than one half the periodicity of said crystal.

13 Claims, 5 Drawing Sheets

REDUCING THE SETTLING TIME OF A CRYSTAL OSCILLATOR

RELATED APPLICATION

This application is a non-provisional application of provisional application Ser. No. 60/720,856, filed Sep. 26, 2005. Priority is claimed to the filing date of provisional application Ser. No. 60/720,856. The entire content of provisional application 60/720,856 is hereby incorporated herein by reference.

FIELD OF THE INVENTION

The present invention relates to electronic circuitry and more particularly to crystal oscillators.

BACKGROUND

Due to the inherent characteristics of certain crystals, they can be made to oscillate at a very precise frequency. Thus, crystal controlled oscillators are often used in applications where a precise frequency is required.

The crystals used to control crystal oscillators behave like a resonant circuit that contains an inductor, a capacitor and a resistor. That is, when a transient signal is applied to a crystal, it oscillates similar to the manner that a resonant circuit oscillates.

Crystal oscillator circuits operate by taking a signal from a crystal, amplifying that signal and feeding the signal back to the crystal to sustain (or increase) the crystal's oscillation. When power is initially applied to a crystal oscillator circuit, random thermal noise, or other random transient signals, initiate oscillations in the crystal. The oscillations grow over time and finally they reach a normal or steady state value. Typically a crystal oscillator takes in the neighborhood of 20,000 to 30,000 cycles to settle into a final amplitude.

FIG. 1A illustrates a prior art crystal oscillator. The oscillator illustrated in FIG. 1A includes a single pin oscillator circuit 10 and a crystal 11. When circuit 10 is powered on, thermal noise or some other type of random transient signal causes the crystal 11 to begin oscillating, the oscillations in crystal 11 are amplified by the single pin oscillator circuit 10 and fed back to the crystal 11. The signal at the terminals of crystal 11 grows as illustrated in FIG. 1B. In FIG. 1B, the horizontal axis is time in nanoseconds and the vertical axis is micro volts of output at the crystals terminals. It is noted that for ease of illustration, FIG. 1B only illustrates a limited number of cycles; however, a substantial number of cycles may be required (typically in the range of 20,000 to 30,000 cycles) before the output signal reaches the normal operating range.

In some applications, the amount of time required to power up and stabilize an oscillator is of great concern. The circuitry described herein reduces the amount of time required to initiate the stable operation of a crystal oscillator.

DETAILED DESCRIPTION

Figure 1A:
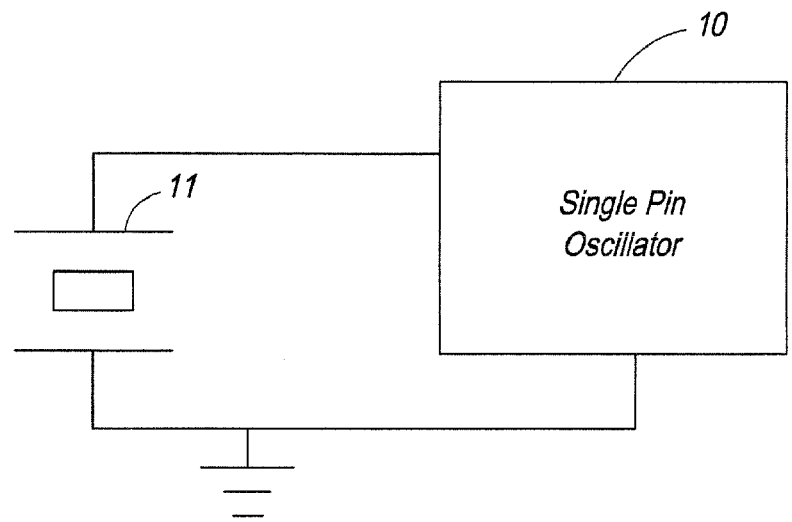
FIG. 1A illustrates a prior art circuit.
Figure 1B:
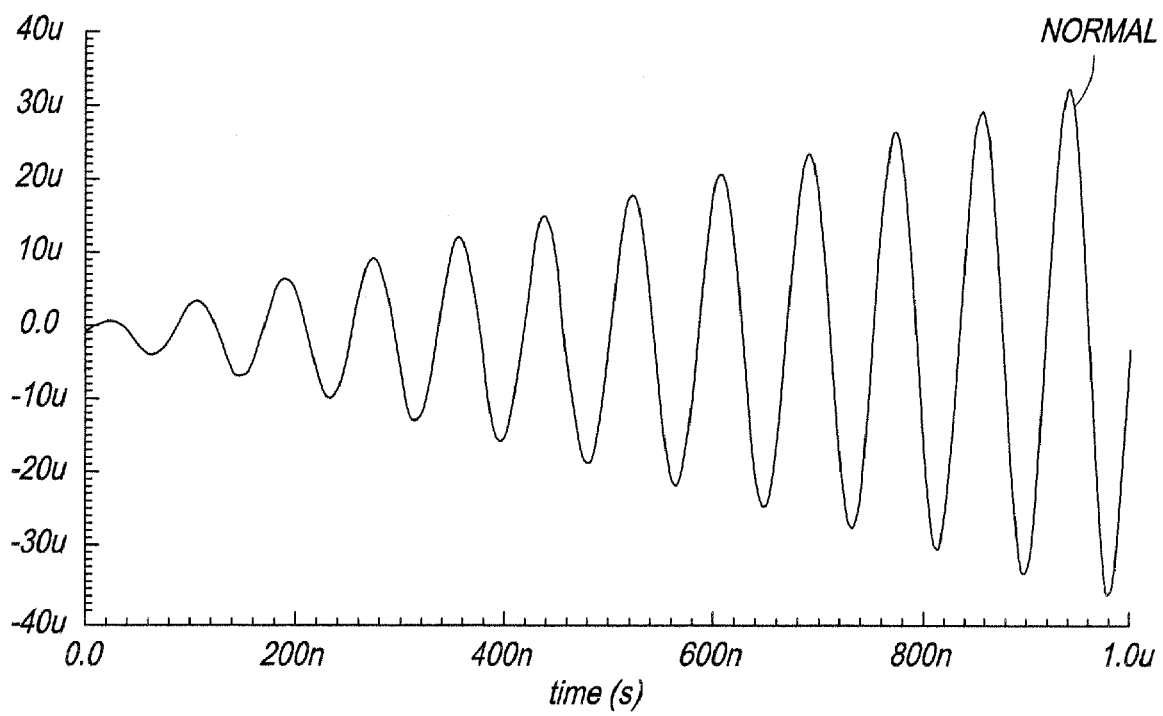
FIG. 1B shows a waveform generated by the crystal shown in FIG. 1A.

Several preferred embodiments of the present invention will now be described with reference to the accompanying drawings. Various other embodiments of the invention are also possible and practical. This invention may be embodied in many different forms and the invention should not be construed as being limited to the embodiments set forth herein.

The figures listed above illustrate the preferred embodiments of the invention and the operation of such embodiments. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the embodiments to those skilled in the art. Those parts and elements not shown are conventional and known in the art.

Figure 2A:
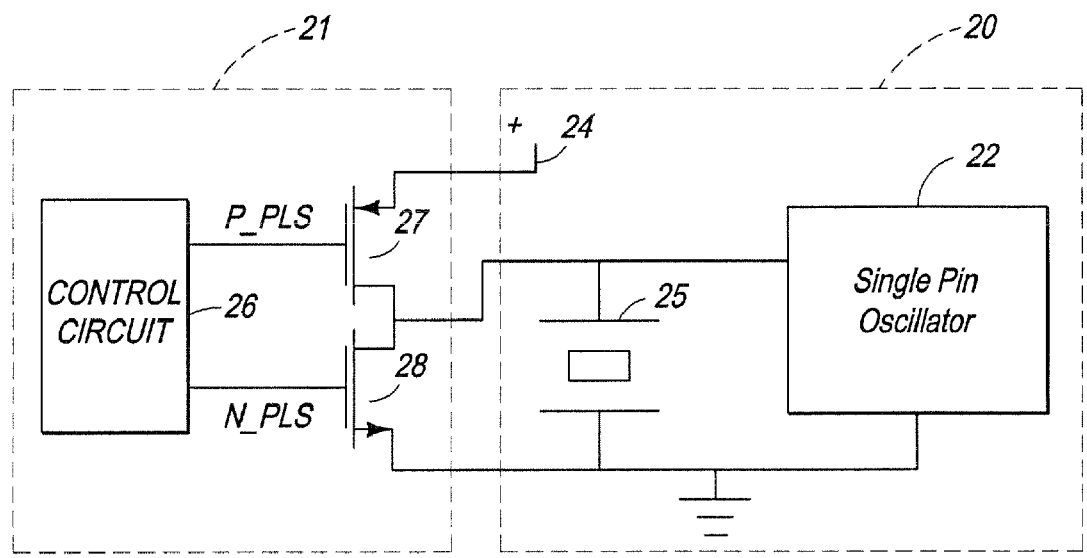
FIG. 2A illustrates a first embodiment.

FIG. 2A illustrates a first embodiment of the present invention. The circuit shown in FIG. 2A has two main parts. The first part of the circuit is a crystal oscillator circuit 20 and the second part of the circuit is a starting pulse generating circuit 21.

The crystal oscillator 20 includes a crystal 25 and a single pin oscillator 22. The single pin oscillator 22 creates a negative resistance, which, when the oscillator is settled (that is, when the oscillator reaches steady state operation), exactly cancels the positive resistance in the crystal 25. Single pin oscillators are known in the art. Such oscillators are sometimes referred to in the technical literature by the synonymous name, negative resistance oscillators. Herein the term single pin oscillator will be used. Single pin oscillator 11 can be a commercially available single pin oscillator.

The crystal 25 is a piezoelectric quartz crystal. The normal frequency of oscillation of the crystal 25 is determined by the physical characteristics of the crystal as is usual. In the specific embodiment illustrated herein, the crystal 25 has a period of 82 nanoseconds (nS).

The starting pulse generator circuit 21 includes a control circuit 26 and two FET transistor switches 27 and 28 connected in a stack. Transistor 27 is a P-FET transistor and transistor 28 is an N-FET transistor.

Figure 2B:
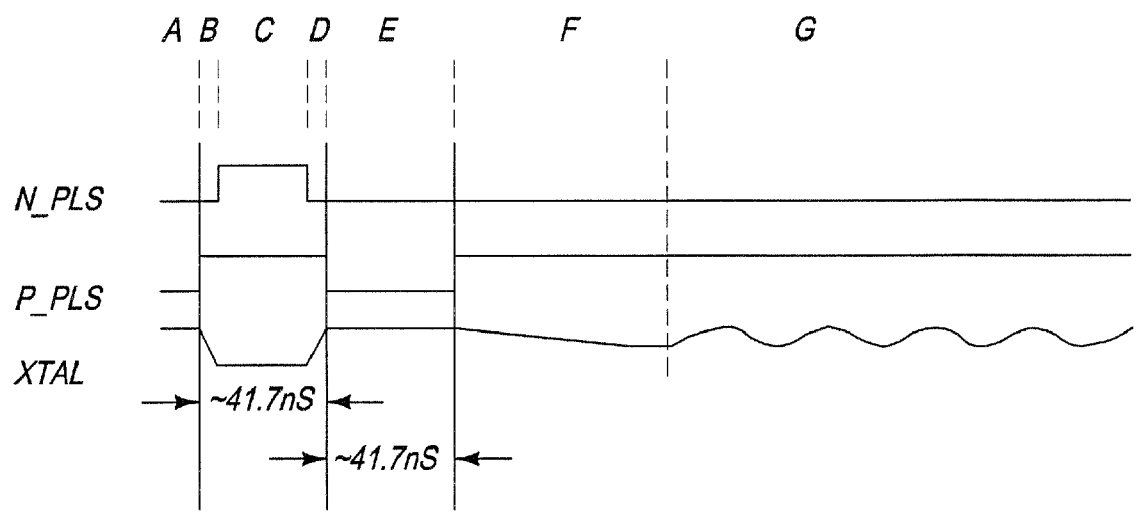
FIG. 2B illustrates waveforms in the circuit shown In FIG. 2A.

Control circuit 26 generates the signals N_PLS and P_PLS illustrated in FIG. 2B. The N_PLS and P_PLS signals control transistors 27 and 28. Seven regions or time periods, designated A, B, C, D, E, F and G, are indicated in FIG. 2B.

In time period A, (that is, prior to the application of a start pulse) transistor 27 is closed and transistor 28 is open. That is, signals N_PLUS and P_PLUS are both low. In this period the power supply potential 24 is applied across the terminals of the crystal.

During time period B, transistor 27 is opened and transistor 28 is also opened. That is, signal N_PLUS is low and signal P_PLUS is high. This is a guard band provided to insure that the power supply is not shorted to ground.

During the period C, the terminals of crystal 25 are shorted through transistor 28. That is, transistor 28 is closed. During this period transistor 27 is opened so that the power supply is not connected to the crystal. That is, both signals N_PLUS and P_PLUS are high. It is noted that during period C, the voltage across the crystal (XTAL in FIG. 2B) is low.

During time period D, transistor 27 is opened and transistor 28 is also opened. That is, signal N_PLUS is low and signal P_PLUS is high. This is a guard band provided to insure that the power supply is not shorted to ground. During period E, transistor 27 is closed and transistor 28 is open. That is, both signals N_PLUS and P_PLUS are low. In this period the power supply potential 24 is again applied across the terminals of the crystal.

During period F (and thereafter), both transistors are open. That is, signal N_PLUS is low and signal P_PLUS is high. Finally in period G, the crystal oscillates normally. The time between when a start pulse is applied and when the crystal begins oscillating normally is relatively short as explained in detail below.

It is noted that during period C, the voltage across the crystal 25 (shown as XTAL in FIG. 2B) decreases and during period D, the voltage across the crystal 25 increases.

In the specific example illustrated, regions B+C+D and E are each 41.7 nS in width. The amount of time required for the crystal to reach a steady state condition is explained by the equations given below.

Figure 3:
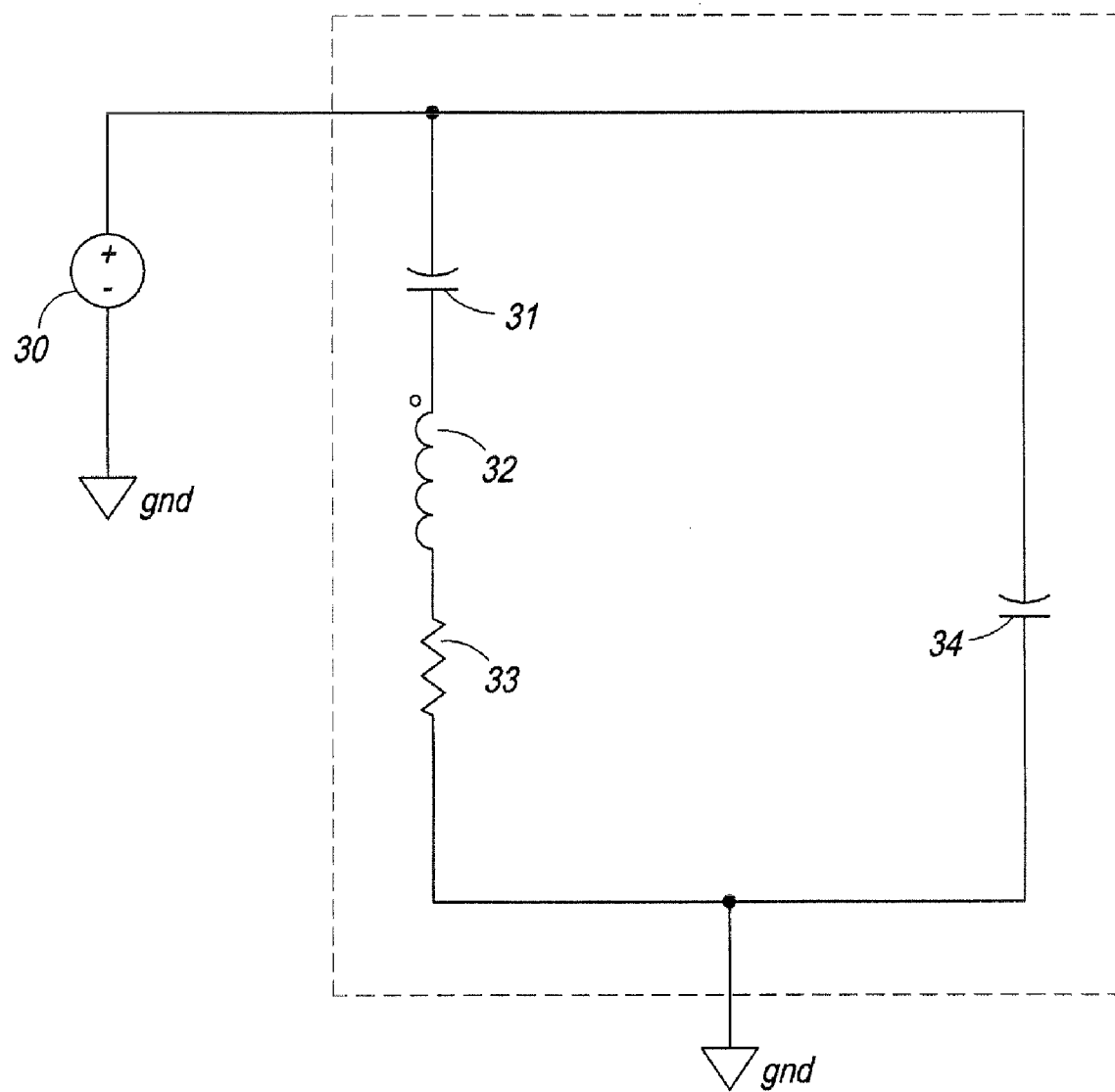
FIG. 3 illustrates the equivalent circuit of a crystal.

A crystal can be envisioned as a resonant circuit such as the equivalent circuit shown in FIG. 3. The circuit includes a driving pulse source 30, a capacitor 31, an inductor 32 and a resistor 33 in series. A capacitor 34 is in parallel with the series connection.

For a typical crystal the components that represent the crystal could have the following values:
Capacitor 31: 10.86 fF (femtofarads)
Inductor 32: 16.2 mH (millihenries)
Resistor 33: 31 ohms
Capacitor 34: 3.89 pF (picofarads)

In such a crystal, the starting current due to thermal noise is about 400 pA. In the embodiment described herein, the initial pulse applied to the crystal provides a starting current of about 3 uA and in steady state oscillation, the current in the crystal is about 800 uA.

The current in the crystal at a time "t" is given by the following equation:

$$I(t) = I\_start * e^{(tau * t)}$$

Where: I(t) is the current at any time "t"
I_(start) is the starting current in the crystal
tau is a time constant
It is noted that in the embodiment shown here tau=120 us
The final current I_final is:

$$I\_final = I\_start * e^{(tau * t\_final)}$$

Where: t_final is the time that the circuit reaches steady state
The amount of time required to reach steady state is:

$$t\_final = tau * Ln(I\_final/start)$$

The comparison of I_start with and without the starting pulse is:
A ratio or factor of 7500 (3uA/400pA=7500)
The amount of time saved, In the time required for the oscillator to reach final amplitude is therefore:

$$tau * Ln(7500) = 9 * tau$$

With thermal noise, t_final=120us*Ln(800uA/400pA) =1.74 ms
However, with the circuit shown here:

$$t\_final = 120us * Ln(800uA/3\ uA) = 0.670\ ms, \text{or about}$$
2.6 times faster startup.

Figure 4:
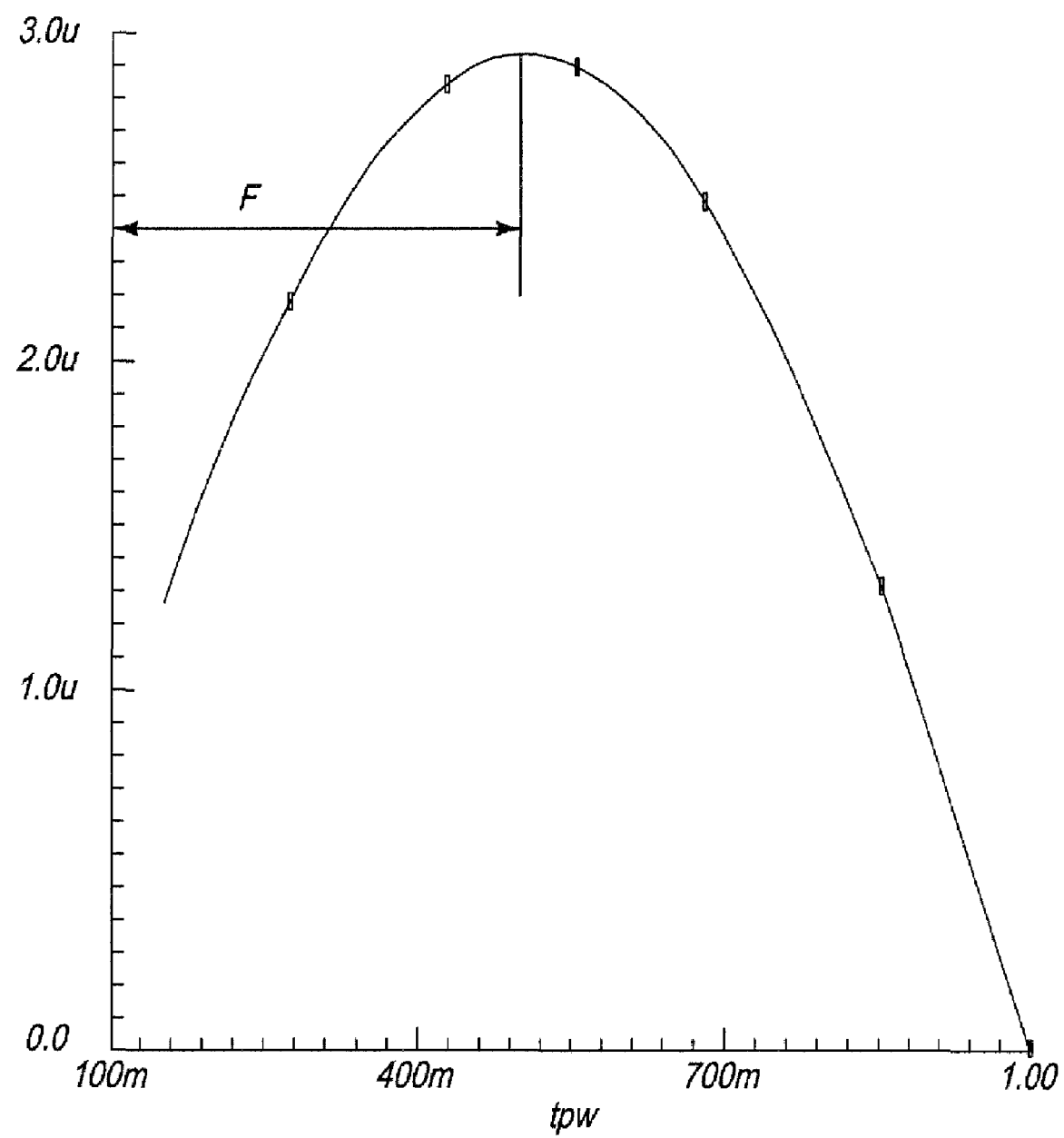
FIG. 4 illustrates crystal output with various width of pulse activation.

The relatively short time required before the crystal reaches normal oscillation is in contrast to the operation shown in FIG. 1A where the crystal output does not reach it normal output for as relatively long period of time. The exact length of the time periods in the operation of the crystal depends upon the specific characteristics of individual crystals. However, the time periods discussed above are representative of typical crystals. FIG. 4 illustrates the reaction of a typical crystal to initiation pulses of various widths. The vertical axis represents current out of a crystal after it is pinged. That is, after a pulse of a particular width is applied. The horizontal axis in FIG. 4 represents the width of a pulse applied to the crystal as a fraction of the period of the crystal's oscillation. As illustrated in FIG. 4, the peak current is induced when the pulse is one half of the period (designated F in the figure) of the crystal's oscillation.

It is noted that in region F, as the pulse width of the initiation pulse increases, the magnitude of the crystal's oscillation increases. The reason for this is that as the pulse width of the initiation pulse increases, the more energy is supplied to the crystal. It is also noted that if the width of the pulse is greater that one half of the crystal's period of oscillation, that is longer than the fraction F, the magnitude of the output decreases.

Figure 5:
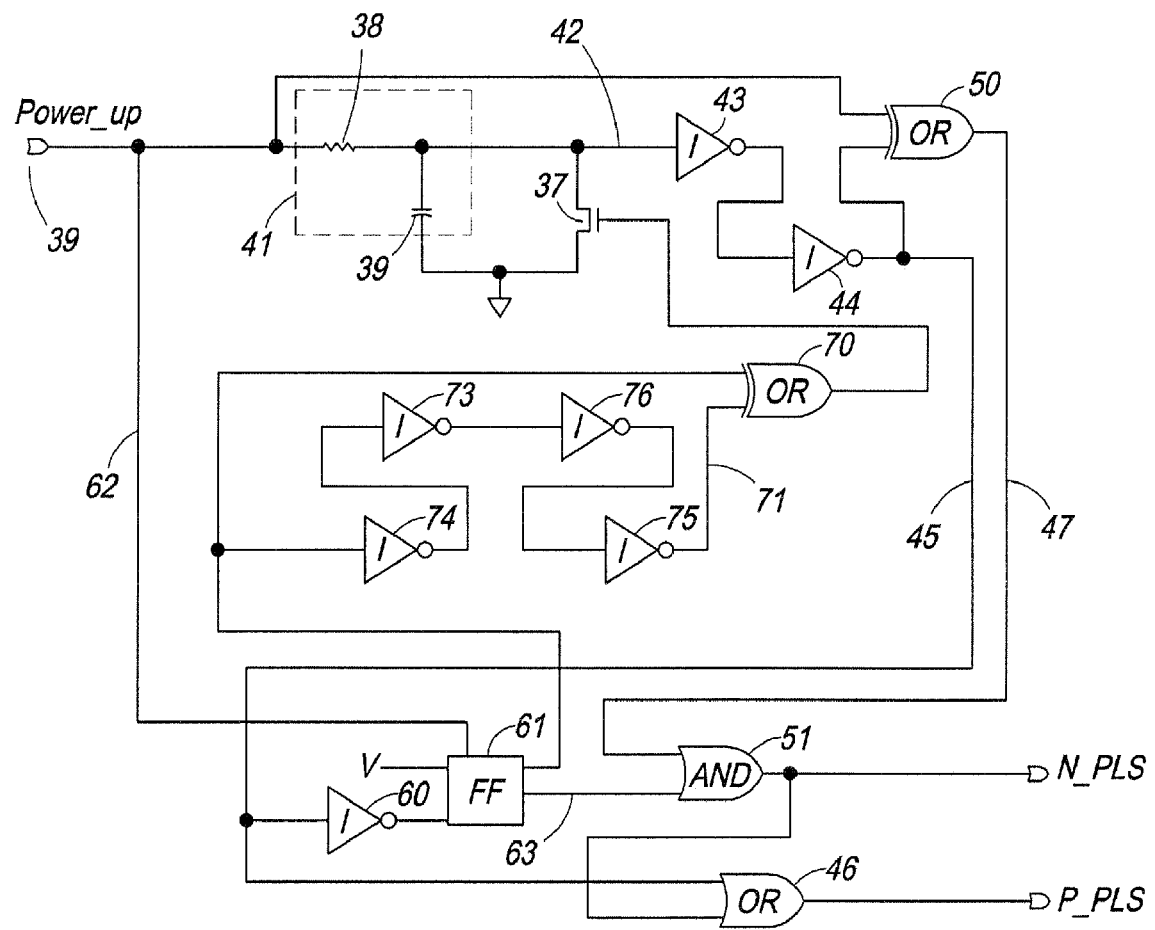
FIG. 5 shows a detailed example of the control circuit shown in FIG. 2A.

FIG. 5 illustrates an exemplary embodiment control circuit 26. Control circuit 26 generates the signals P_PLS and N_PLS that are shown in FIG. 2B. It is noted that the circuit shown in FIG. 4 is merely exemplary and various other types of circuits could be used to generate the signals shown in FIG. 2B.

Control circuit 26 includes a number of OR circuits, a number of Inverters, a number of Exclusive OR circuits and a number of AND circuits connected as shown in the FIG. 5. Circuit 26 also includes a transistor switch 37, a bi-stable circuit (that is a flip flop) 61 and an RC circuit 41 that includes resistor 38 and capacitor 39. All the components in circuit 26 are standard, commercially available components.

The RC circuit 41 controls the length of the pulses. That is the length of the periods B+C+D and E illustrated in FIG. 2B. The RC circuit 41 includes a resistor 38 and a capacitor 39, which together form an RC circuit. The time constant of this circuit determines the length of the time periods B+C+D and E.

Exclusive OR circuit 70 and inverters 73, 74, 75 and 76 provide a circuit which closes transistor 37 for a short period of time. The length of the pulse at the output of Exclusive OR circuit 70 is determined by the delay introduced by the four inverters 73 to 76. The length of time that transistor 37 is closed determines the length of the time periods B and D illustrated in FIG. 2B. That is closing transistor 37 for a short period of time insures that signal N_PLS is low for this short period of time.

When a power up signal is applied at terminal 39, after a slight delay introduced by Inverters 43 and 44, a signal appears on line 45. The signal on line 45 activates the P_PLS output through OR circuit 46.

Flip flop 61 is reset by the signal on line 62 and it is set by the output of inverter 60. The output of flip-flop 61 together with the output of Exclusive OR 50 activates output N_PLS. Flip-flop 61 insures that only a single pulse appears on output lines N_PLS and P_PLS as indicated in FIG. 2B.

In summary, control circuit 26 generates the P_PLS and N_PLS pulses that control FET transistors 27 and 28. Transistor 28 is normally open; however, it is momentarily closed to create a short across the terminals of crystal 25. Transistor 27 is initially closed to apply an initial charge across the crystal. It is then opened while transistor 28 is closed. After transistor 28 is opened, transistor 27 is again closed to apply a voltage pulse to the crystal 28. This begins the oscillations in the crystal 25.

It is noted that in the embodiment shown herein, circuit 26 only generates a single pulse that is applied to crystal 25 in order to initiate oscillations in the crystal. In other embodiments a series of pulses could be applied to the crystal. However, in such an embodiment, it would be necessary to insure that the period of the pulses applied, coincides to some degree with the periodicity of the crystal. Otherwise, pulses out of synchronization with the oscillation of the crystal could actually decrease crystal oscillation.

While the invention has been shown and described with respect to preferred embodiments thereof, it should be understood that a wide variety of other embodiments are possible without departing from the scope and sprit of the invention. The scope of the invention is only limited by the appended claims.

I claim:

1. A method of initiating oscillation of a crystal, having a native frequency with a particular cycle length, said method comprising:
    first applying charge across said crystal;
    next creating a short circuit across said crystal; and
    next applying voltage pulse to said crystal, said voltage pulse having a width equal to about one half said cycle length,
    whereby oscillations are quickly initiated in said crystal, wherein said initiating terminates after applying a single said voltage pulse.

2. The method recited in claim 1 wherein said crystal is maintained in oscillation by amplifying the output of said crystal and feeding said amplified signal back to said crystal.

3. The method of claim 1 wherein said crystal is a piezoelectric quartz crystal.

4. An oscillator circuit comprising:
    a crystal connected to two terminals, said crystal having a native frequency with a particular cycle length;
    an amplifier for amplifying the output of said crystal and feeding said amplified output back to the terminals of said crystal;
    a starting circuit for applying a charge across said crystal, creating a short circuit across said crystal, and applying a pulse to said crystal to initiate oscillation of said crystal, said pulse having a width equal to about one half said cycle length, wherein said initiation terminates after applying a single said pulse.

5. The oscillator circuit recited in claim 4 wherein said crystal is maintained in oscillation by amplifying the output of said crystal and feeding said amplified signal back to said crystal.

6. The oscillator circuit recited in claim 4 wherein said crystal is a piezoelectric quartz crystal.

7. The oscillator circuit recited in claim 4 wherein said amplifier is a single pin oscillator circuit.

8. The oscillator circuit recited in claim 4 wherein said amplifier is a negative resistance amplifier.

9. The oscillator circuit recited in claim 4 wherein said starting circuit comprises a P-PET transistor and an N-FET transistor connected in a stack, said P-FET transistor connected to a power source and said N-FET transistors connected to ground.

10. The oscillator circuit of claim 4 wherein said starting circuit comprising:
    a P-FET transistor and an N-FET transistor connected in a series stack, and joined at a junction; and one terminal of said crystal being connected to ground and the other terminal of said crystal being connected to said junction.

11. A circuit for initiating oscillation in a crystal, said circuit comprising:
    a PFET and an NFET transistor connected in series by a junction, each of said transistors having a source and a drain, the source of said PFET being connected to a power source and the source of said NFET being connected to ground;
    said crystal being connected between said junction and ground; and
    a circuit for first charging said crystal by closing said PFET, then opening said PFET and closing said NFET, then closing said PFET and opening said NFET and finally opening both said PFET and said NFET.

12. An oscillator circuit comprising:
    a crystal, said crystal having a native frequency with a particular cycle length;
    a single pin oscillator connected across said crystal; and
    a starting circuit for initiating oscillation of said crystal by applying a charge across said crystal, creating a short circuit across said crystal, and applying an initiating pulse to said crystal, said pulse having a width equal to about one half said cycle length, wherein said initiating terminates after applying a single said initiating pulse.

13. The circuit recited in claim 12 wherein said starting circuit comprises a stack of a PFET transistor, the source of which is connected to a power supply and a an NFET transistor the source of which is connected to ground and a control circuit to close and open said transistors to apply an initial pulse to said crystal to quickly initiate oscillation of said crystal.

* * * * *